US007360183B2

(12) United States Patent
Bhadra et al.

(10) Patent No.: US 7,360,183 B2
(45) Date of Patent: Apr. 15, 2008

(54) DESIGN ANALYSIS TOOL AND METHOD FOR DERIVING CORRESPONDENCE BETWEEN STORAGE ELEMENTS OF TWO MEMORY MODELS

(75) Inventors: Jayanta Bhadra, Austin, TX (US); Magdy S. Abadir, Austin, TX (US); Himyanshu Anand, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 217 days.

(21) Appl. No.: 11/007,705

(22) Filed: Dec. 8, 2004

(65) Prior Publication Data

US 2006/0120167 A1 Jun. 8, 2006

(51) Int. Cl.
*G06F 17/50* (2006.01)
*H03K 17/693* (2006.01)
(52) U.S. Cl. ............................................. 716/3; 716/16
(58) Field of Classification Search ................. 716/4–5, 716/7, 3, 16
See application file for complete search history.

(56) References Cited

U.S. PATENT DOCUMENTS

| 5,638,381 | A | 6/1997 | Cho et al. ..................... 714/732 |
| 6,408,424 | B1* | 6/2002 | Mukherjee et al. ............. 716/5 |
| 6,457,162 | B1* | 9/2002 | Stanion ........................ 716/7 |
| 2002/0144215 | A1* | 10/2002 | Hoskote et al. ................ 716/3 |
| 2003/0154485 | A1* | 8/2003 | Johnson et al. ............... 725/89 |
| 2004/0083443 | A1* | 4/2004 | Ogawa et al. ................ 716/18 |

OTHER PUBLICATIONS

Demos Anastasakis, et al., "A Practical and Efficient Method for Compare-Point Matching," DAC 2002, Jun. 10-14, 2002.
Mukul R. Prasad, et al., "Solving the Latch Mapping Problem in an Industrial Setting," DAC 2003, Jun. 2-6, Anaheim, CA (pp. 442-446).
Burch, Jerry R. and Singhal, Vigyan; "Robust Latch Mapping for Combinational Equivalence Checking"; Cadence Berkeley Labs; 1998; 7 pages.
van Eijk, C.A.J.; "Sequential Equivalence Checking Without State Space Traversal"; Design Automation Section, Eindhoven Unvi. of Tech., The Netherlands; Feb. 1998; 6 pages.

* cited by examiner

*Primary Examiner*—Jack Chiang
*Assistant Examiner*—Suresh Memula
(74) *Attorney, Agent, or Firm*—John A. Fortkort; Fortkort & Houston P.C.

(57) ABSTRACT

A method and system automatically generates a bit-cell correspondence between a first memory model and a second memory model of a memory. The method includes receiving data from the first and the second memory model, obtaining true-inverted fan-in cones for words in the memory models to obtain correspondence between sets of words in the two models, writing word binary sequences into the words to obtain a set of bit-cell correspondences, and using inherent structural information in memory designs to generalize bit-cell correspondence obtained on bit-cells of a pair of corresponding words to obtain bit-cell correspondence information for all the bit-cells in the memory models. Correspondence is detected if one of the bit-cell binary sequences written into a bit-cell in the first memory model is equal to or an invert of another of the bit-cell binary sequences written into a bit-cell in the second memory model.

26 Claims, 7 Drawing Sheets

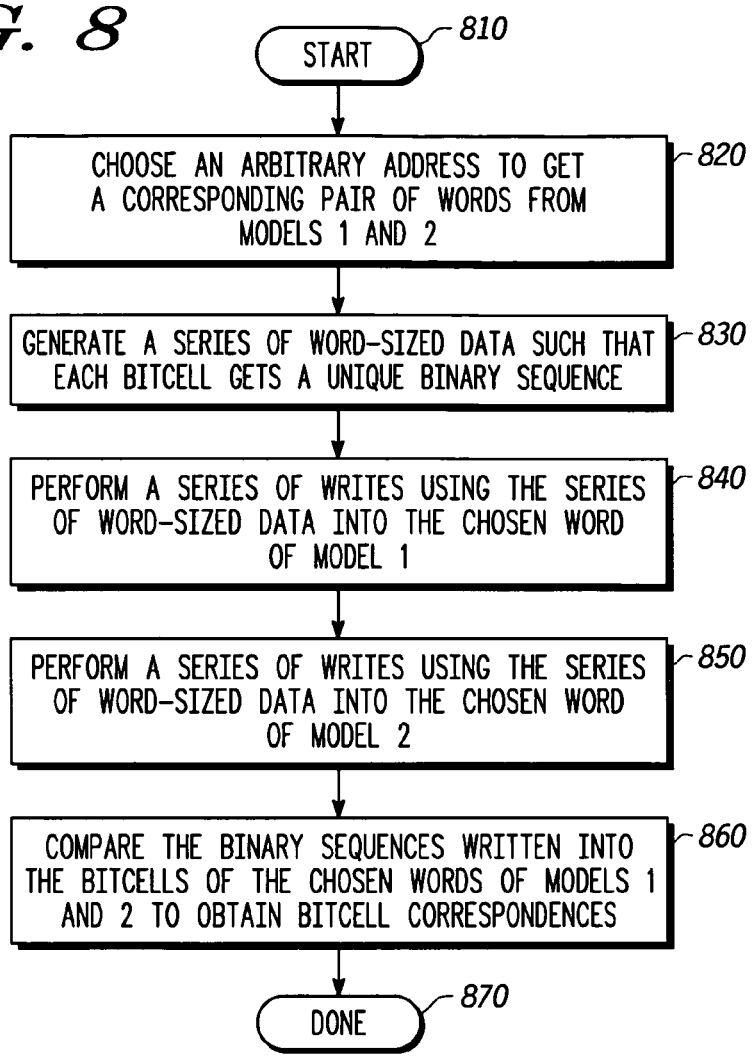
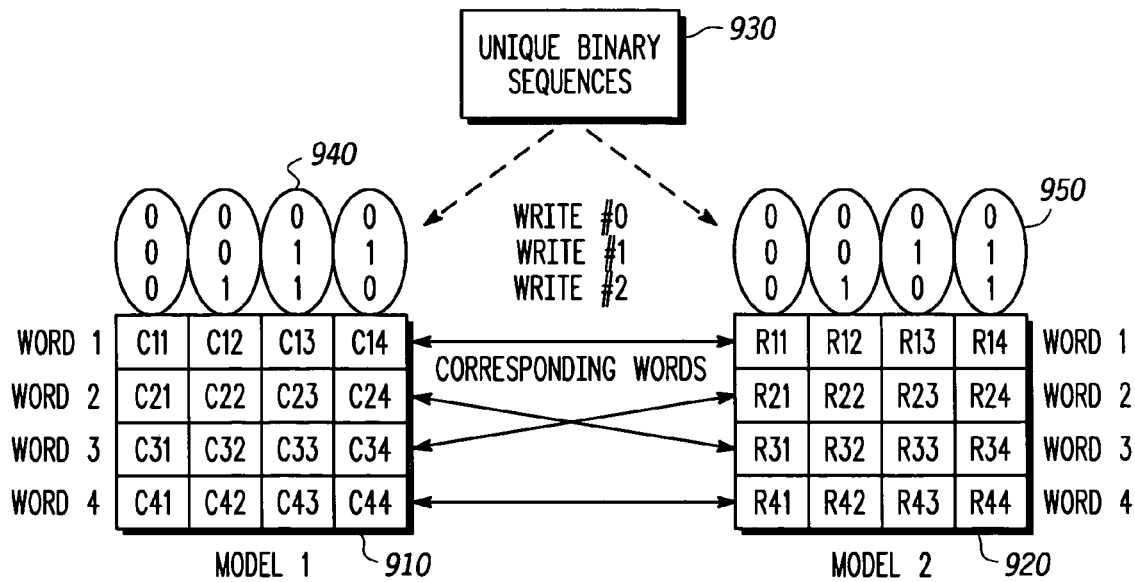

DESIGN ANALYSIS TOOL AND METHOD FOR DERIVING CORRESPONDENCE BETWEEN STORAGE ELEMENTS OF TWO MEMORY MODELS

TECHNICAL FIELD

This invention relates generally to hardware design verification and more specifically to identifying correspondence between storage elements of a first memory model and storage elements of a second memory model.

BACKGROUND OF THE INVENTION

On-chip memories take up a major portion of the area of most modern high performance microprocessors available today. Due to the complexity of modern microprocessors, functions performed by on-chip memories, and other functional blocks, designs of microprocessors are complicated. Several models of a same microprocessor can be required spanning many levels of abstraction, beginning with a conceptual design addressing a desired functionality at a top level model and ending with a detailed model including information needed to construct the microprocessor on a silicon wafer.

The set of models representing the same microprocessor is called a design hierarchy. Typically, for a microprocessor design, different models can include a high level design described using a high level language suited for representing conceptual designs, a register transfer level (RTL) design described using a language suited for RTL descriptions, a gate-level design described using logic gates, and a circuit level design described using transistors, a physical design that is used to generate mask sets that are used in the fabrication process of laying out the microprocessor onto a silicon wafer or other substrates.

The process of designing successively detailed models for the same microprocessor is known as abstraction refinement.

As a part of the complete design, memories are also designed at each of the levels of abstraction, starting from the most abstract level model and ending at the most detailed level. The process of translation from one level to the next lower level is often manual. In such cases, design errors are common.

To address the problem of frequent errors, designers carefully check that each pair of successive levels of abstraction maintains functional equivalence. Therefore, verification of equivalence between two different descriptions of the memories and the ability to debug discrepancies between descriptions is of paramount importance for the semiconductor industry. To verify equivalence between two memory models, it is important that the user has the ability to provide correspondence between the storage elements (also known as bit-cells) that make up the two memory models.

When a memory design is taken from one level of abstraction to the next lower level of abstraction, certain aspects of the lower level design dictates the organization of the memory bit-cells in that level. For example, wafer size, power and speed of circuit operation considerations may require the organization of memory bit-cells at the transistor level model to be completely different from the organization of memory bit-cells at the RTL and/or the gate-level designs, because at those levels size, power and speed considerations are not very important. Therefore, due to the disparate memory organizations, the correspondence between the bit-cells of the RTL and transistor level memory models may be very complex and it may be time-consuming and error-prone to find the correspondence easily without the aid of a sophisticated automated mechanism.

Efficient automated solutions for identifying corresponding bit-cells of two memory models are, thus, required for efficient design and verification of memory models across the design hierarchy.

Currently, there are no methods that satisfactorily identify correspondence between bit-cells of two memory models. There are, however, techniques that find correspondence between storage elements, also referred to as "latches," of two general purpose circuit models. Such methods that are effective for finding latch correspondence become extremely inefficient when applied to the problem of identifying bit-cell correspondence between two memory models.

One reason the latch correspondence methods are inefficient is that the methods for finding latch correspondence fail to address characteristics inherent in memory designs. Further, as one skilled in the art will readily appreciate, the large size of today's modern microprocessor memories make the latch correspondence techniques encounter what is known as the "state explosion" problem. The state explosion is a phenomenon in which the time and/or space required for solving a problem increases exponentially with the size of the problem. When known methods of finding latch correspondence are applied to find memory bit-cell correspondence, state explosion is encountered in the form of spending time and/or space that increases exponentially with respect to the number of bit-cells in the memory design—a number that in itself might be very large. For example, an "L2 cache" can have an on-chip memory present on almost every state-of-the-art microprocessor, and can have a million bit-cells. Therefore, all known methods of latch correspondence fail to perform bit-cell identification within an acceptable period of time and/or space on a relatively large memory design.

One prior art method teaches an iterative process that groups latches together into potential matches using the respective fan-in cones, fan-out cones and random simulation. The method fails to perform for memory circuits. First, all bit-cells in a given memory word have the same fan-in cone and so cannot be distinguished using fan-in analysis. Second, all bit-cells in the same memory column of a memory have the same fan-out cone and so cannot be distinguished using fan-out analysis. Third, being able to write into memory words using random simulation has no guarantee of success because, in the worst case, random simulations may never be able to write into a memory model using randomized input values. The prior art method does not guarantee finding the correspondence between the bit-cells of the two memory models. Thus, especially for memory circuits, the prior art is ineffective at finding correspondence of bit-cells between two memory descriptions.

Other prior art methods for latch correspondence use name-based information. As one skilled in the art will readily appreciate, however, there is little basis for matching memory bit-cells using the names of the bit-cells because, due to different hierarchy requirements at two different levels of abstraction, memory bit-cell names typically do not match between two different levels of memory models. Such name-based methods are, therefore, unable to find the correspondence between bit-cells of two memory models.

Other methods for finding latch correspondence employ functional fixed point iterations to refine the universe of all latches to find the correspondence. A problem with functional fixed point iterations is that the refinement process used is lengthy and inefficient because it explores all possible circuit behavior described in the circuit model. Due to the large size of modern memories these methods tend to experience state explosion and therefore, these methods are not effective for finding bit-cell correspondence for memory models. Therefore, when applied to modern memory designs with a large number of bit-cells, these methods take a disproportionately large amount of time (maybe years) to return a result.

What is needed is an apparatus and method for deriving correspondences between bit-cells of two different memory models of the same or different levels of abstraction that is efficient and can be effectively used in the design of a modern integrated circuit. There is a need for such an apparatus and method to enable a user to find bit-cell correspondence multiple times while moving a design from one level of abstraction to the next lower level of abstraction, from one design to a second design, or at the same level of abstraction.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

FIG. 8 is a flow diagram illustrating how bit-cells in a pair of corresponding words in memory models 1 and 2 are identified as shown in FIG. 3 in accordance with an embodiment of the present invention.

FIG. 9 is a block diagram illustrating how correspondence between each of the bit-cells in a pair of corresponding words in memory models 1 and 2 can be found as provided in FIG. 8 including two bit cell groups in accordance with an embodiment of the present invention.

DETAILED DESCRIPTION OF THE INVENTION

Figure 1:
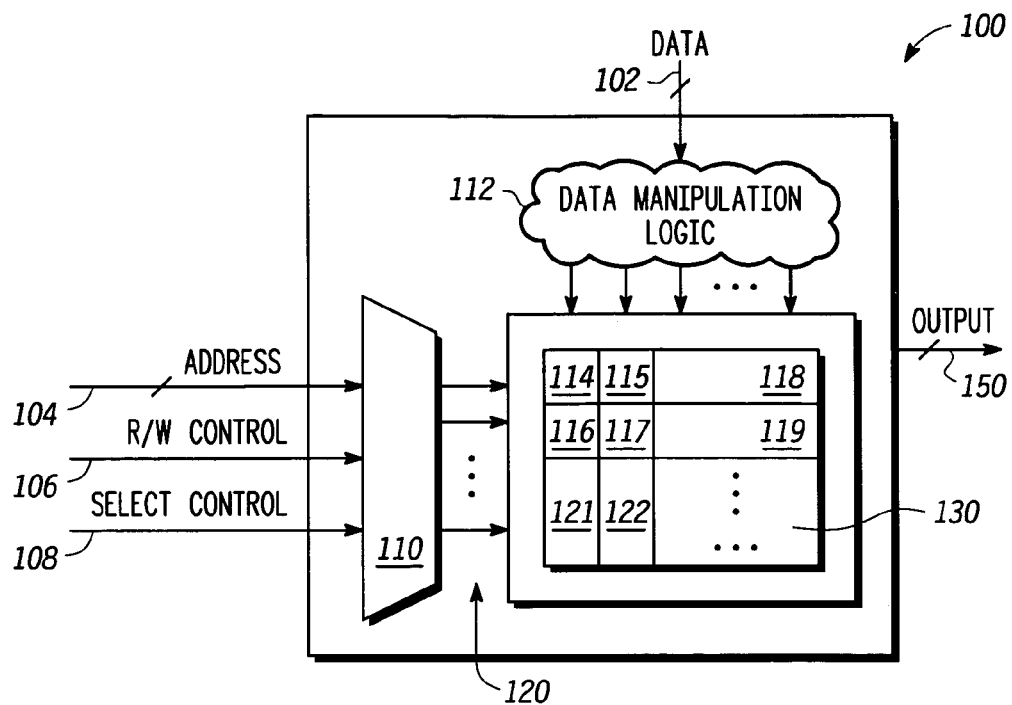
FIG. 1, labeled "prior art," is a block diagram of memory appropriate to implement embodiments of the present invention.

Turning to the drawings, wherein like reference numerals refer to like elements, an embodiment of the invention is illustrated as being implemented in a suitable environment.

FIG. 1, labeled "prior art", illustrates a block diagram of memory 100. The memory includes a plurality of bit-cells, such as 114, 115, 116, 117, a plurality of words (each word being a plurality of bit-cells addressed by the same address), such as 118 and 119, and a plurality of columns (each column being a plurality of bit-cells where each bit is addressed by a different address), such as 121 and 122. Also shown is a plurality of data lines 102, a plurality of address lines 104, a plurality of read and/or write control lines 106, a plurality of select control lines 108. Lines 102 are coupled to the memory via a plurality of data manipulation logic 112 to each of the memory words. Note that data manipulation logic, 112, is an optional structure in that it is absent in some memory designs. The lines 102, 104, 106 and 108 are collectively called "primary inputs". Each of lines 104, 106 and 108 are received by a decoder 110, which is coupled via a plurality of word select lines 120 to a plurality of bit-cells 130. The word select lines are configured to select a single word for writing incoming data into the memory word as well as reading data from the memory word in order to provide the read data to the output 150. Output 150 is often called "primary output". The memory 100 shown can be described using several levels of design abstractions that describe the same memory 100. Two such descriptions include register transfer level (RTL) and circuit level designs. To ensure that the two designs (at two different levels of abstraction or the same level of abstraction) are equivalent, first it is necessary to find out the correspondence between the bit-cells of the two memory models, and the following embodiment provides a method for automatically finding the correspondence between the bit-cells of the two memory models. Embodiments described herein also address the problem of finding bit-cell correspondence between two memory designs at the same level of abstraction.

Figure 2:
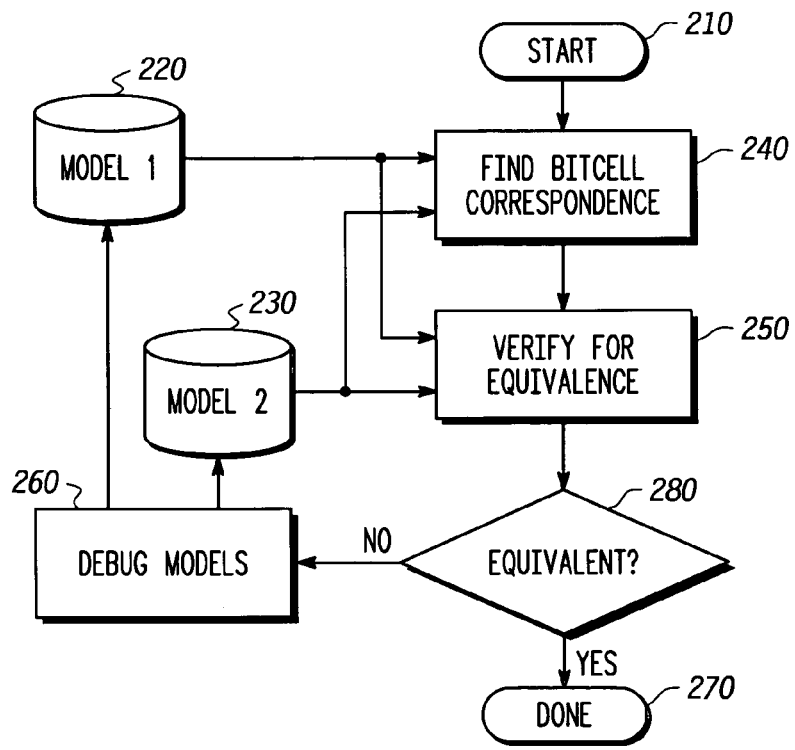
FIG. 2 is a flow diagram that illustrates a method for checking the equivalence between two models of a memory in accordance with an embodiment of the present invention.

Referring to FIG. 2, labeled "prior art", a flow diagram illustrates a method for checking the equivalence between two models (at the same or different levels of design abstraction) of the memory 100. As shown, the method starts at block 210. Blocks 220 and 230 represent memory models 1 and 2, respectively, which provide data to block 240 and to block 250. Block 240 represents performing a method that identifies bit-cell correspondence between the memory models 1 and 2. Block 240 represents the manually generated bit-cell correspondence between the two descriptions of the same memory design. As explained in detail below, manually generated correspondence is replaced by the current embodiments directed to automatically generating bit-cell correspondence as explained below. Block 240 is coupled to block 250, which provides for verifying the equivalence between memory models 1 and 2. According to an embodiment, the output from block 250 is provided to a decision block 280 that provides for determining if the models are equivalent. If not, control is provided to debug block 260. Debug block 260 determines inconsistencies and corrects the memory model data. The entire process (of finding bit-cell correspondence and checking equivalence) is repeated with the modified memory model data, as shown by the connections to model 1 (220) and model 2 (230). If the altered memory models prove to be equivalent by block 250, decision block 280 determines that the two memory descriptions are proved to be equivalent and the method ends in block 270.

Figure 3:
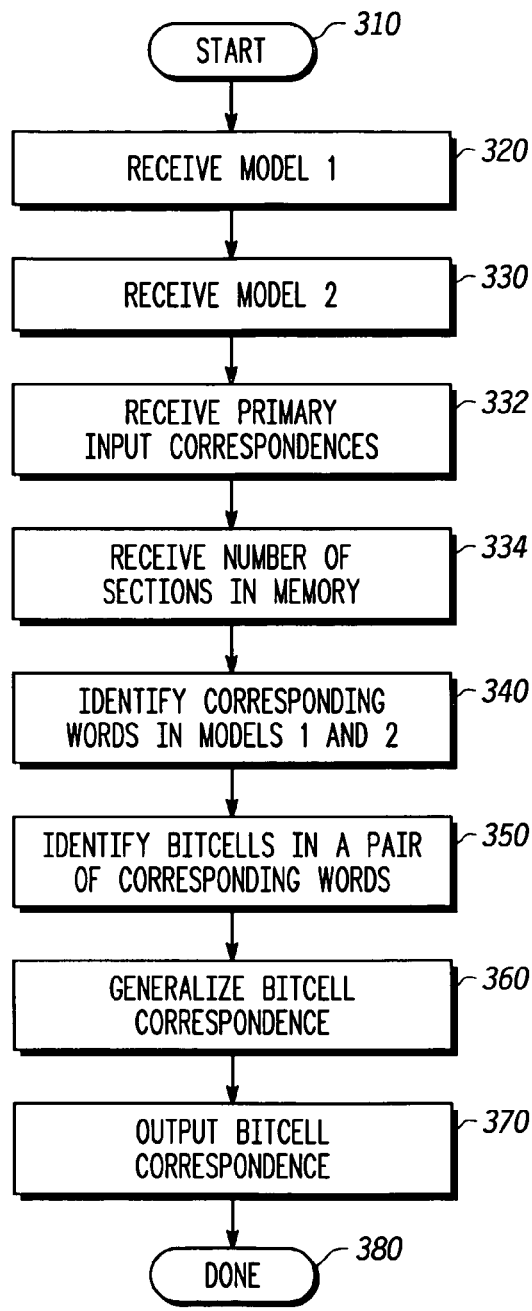
FIG. 3 is a flow diagram illustrating a portion of the method for finding bit-cell correspondence as shown in FIG. 2 in further detail in accordance with an embodiment of the present invention.

Block 240 is shown in more detail in FIG. 3. More specifically, FIG. 3 illustrates a method according to an embodiment for finding correspondence between bit-cells of memory model 1 and model 2. As shown, the method begins with start block 310. Block 320 provides for receiving data from model 1. Block 330 provides for receiving data from model 2. Block 332 provides for receiving primary input correspondences. Block 334 provides for receiving the information regarding the number of sections in the two memory models. A section is a portion of a memory model wherein each column of bit-cells is connected to a single data line. Equivalently, a section of memory can be described as one wherein the bit-cell data line orientation does not change with different words. Typically, a memory has a number of sections that is known to the designer of the memory. As one skilled in the art would appreciate, the sequence in which input blocks 320, 330, 332 and 334 are invoked can be interchanged without changing the fundamental procedure. Block 340 provides for identifying corresponding words in models 1 and 2, as described in further detail below. For purposes of this disclosure, a "word" may refer to both a word or a word line in a circuit level model and a word in an RTL model. A circuit-level description refers to a design description with logic constructed by transistors, and not AND/OR/NOT etc. gates. At all levels of design description, the memory includes a collection of words, each having a unique address. The same is true about circuit-level designs as well. In circuit-level designs, words are almost always represented using the corresponding word-line. To find true-inverted fan-in cones for words in circuit level designs, the term "word" shall include the word lines associated with corresponding true-inverted fan-in cones. Block 350 provides for identifying bit-cells in a pair of corresponding words. Block 360 provides for generalizing bit-cell correspondence.

More particularly, block 340 represents identifying correspondence between each element of a first set of words from memory model 1 and each element of a second set of words from memory model 2, block 350 represents identifying correspondence between bit-cells of a first word from memory model 1 and a second word from memory model 2 that were previously identified to be corresponding (from block 340), and block 360 represents using intrinsic characteristics of memory designs to generalize correspondence among bit-cells of all pairs of corresponding words of the memory models. The blocks 340, 350 and 360 are repeated as many times as there are number of sections in the memory models. Thus, if a priori knowledge of the number of sections in the memory is known or provided, the number of sections is used to determine how many times to repeat blocks 340, 350 and 360. Block 370 provides for outputting a bit-cell correspondence. After an output is provided, control passes to block 380 indicating the process is complete.

Figure 4:
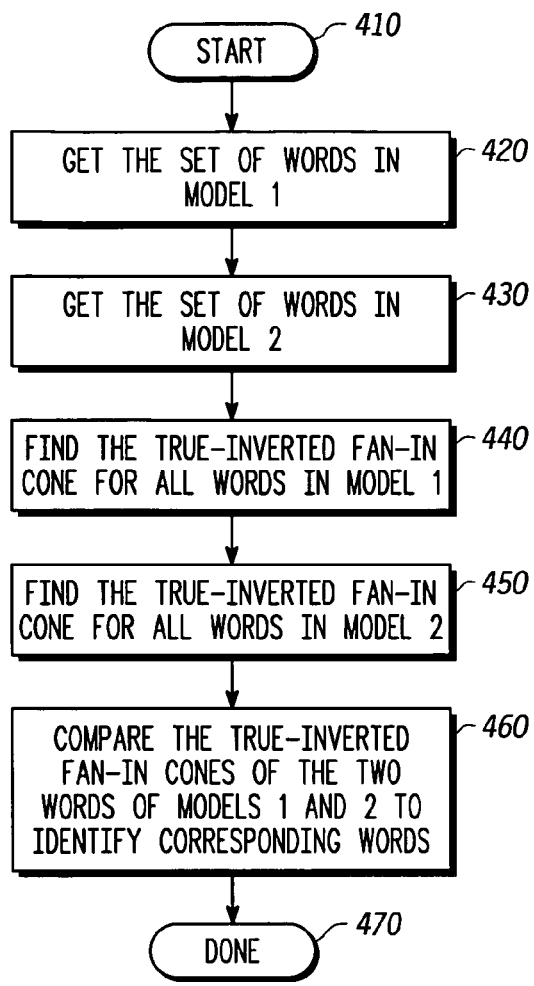
FIG. 4 is a flow diagram that further illustrates the method shown in FIGS. 2 and 3 by describing how corresponding words in memory models 1 and 2 are identified in accordance with an embodiment of the present invention.

Referring now to FIG. 4, a flow diagram further illustrates the method shown in FIGS. 2 and 3 by describing how corresponding words in models 1 and 2 are identified as shown by block 340 in FIG. 3. Block 410 begins the process. Block 420 provides for getting the set of words in model 1. Block 430 provides for getting the set of words in model 2. Block 440 provides for finding the true-inverted fan-in cone for all words in model 1. Block 450 provides for finding the true-inverted fan-in cone for the words in model 2. Block 460 provides for comparing the true-inverted fan-in cones of two sets of words of models 1 and 2 to identify corresponding words. Block 470 represents the completion of the method. After the termination of this process, given any word from model 1 (or model 2), the corresponding word from model 2 (or, model 1) is then confirmed.

Figure 5:
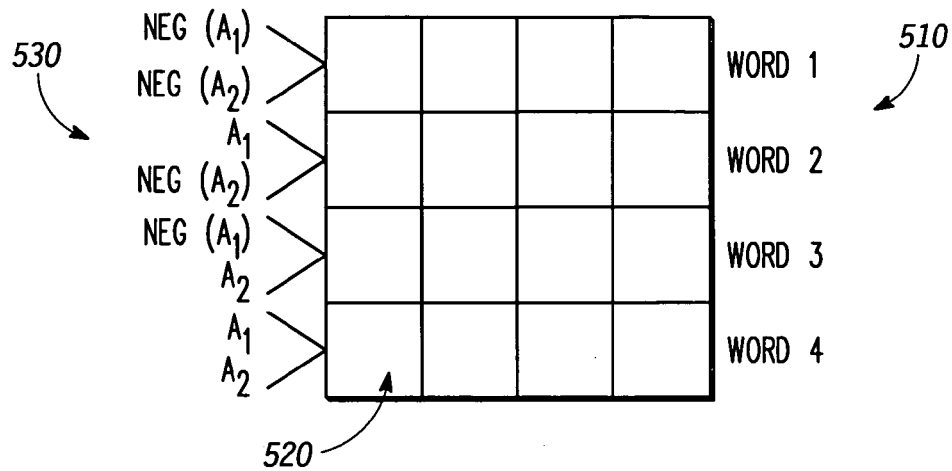
FIG. 5 is a block diagram of a memory model illustrating how a true-inverted fan-in cone is used as provided in FIG. 4 in accordance with an embodiment of the present invention.

Referring now to FIG. 5, an example illustrates further detail for calculating a true-inverted fan-in cone as provided in blocks 440 and 450 of FIG. 4. A plurality of words 510 and a plurality of fan-in cones 530 are illustrated that demonstrate how a true-inverted identification could be performed. As shown, "neg(A)" denotes that the address bit A is present in an inverted state and has a value of zero for addressing the particular word. Table 1 below illustrates the mapping shown in FIG. 5:

TABLE 1

| A1 A2 (Address lines) | Addressed Word |
|---|---|
| 00 | 1 |
| 10 | 2 |
| 01 | 3 |
| 11 | 4 |

The word 1 is addressed when the address lines A1=0 and A2=0. Therefore, the true-inverted fan-in of word 1 is {neg(A1), neg(A2)}, since both A1 and A2 require inverted/complemented (zero) values to address the word 1. For word 2, on the other hand, the true-inverted fan-in cone is {A1, neg(A2)} because word 2 is addressed when address line A1 is in its true state (one) and address line A2 is in its inverted state (zero). Likewise, for words 3 and 4 the true-inverted fan in cones are {neg(A1), A2} and {A1, A2} respectively, as shown in FIG. 5. The prior art describes an artifact called fan-in cone wherein only the names (and not the true-inverted nature of address pins) are obtained. Thus, for fan-in cone analysis, all words, 510, with bits 520, will have the same fan-in cone {A1, A2}. A simple fan-in cone analysis of any word returns an entire set of address lines and can be of minor use in distinguishing between different words. Thus, a simple fan-in cone analysis would not be able to find word correspondence for purposes of identifying bit-cells for purposes of comparing models as taught by embodiments herein.

Figure 6:
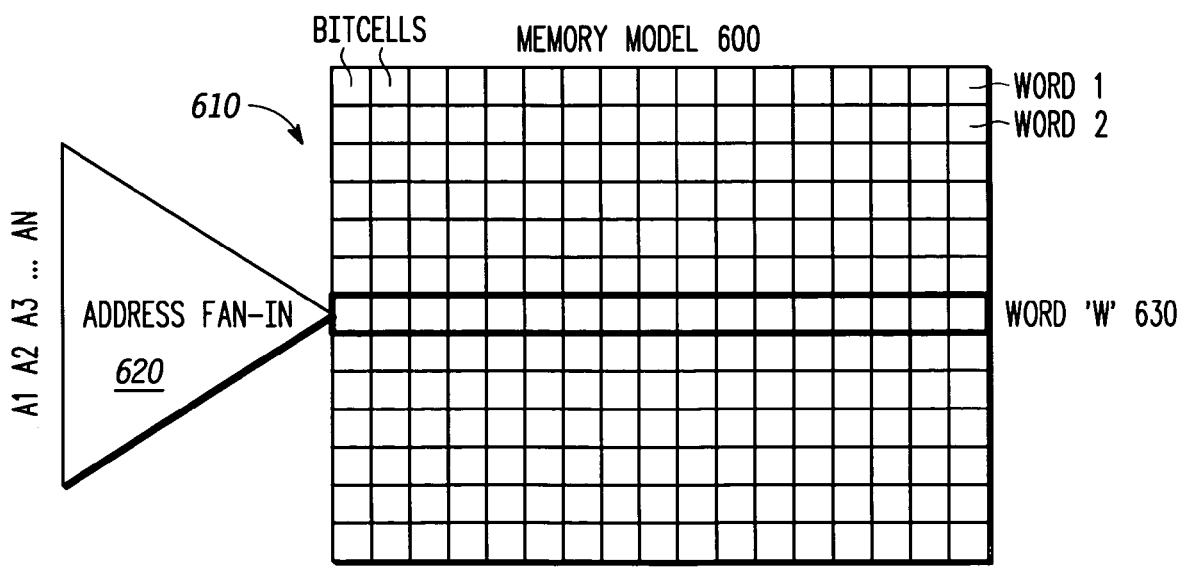
FIG. 6 is a generalized description of true-inverted fan-in cone of a word of a memory appropriate as an illustration of embodiments of the present invention.

Referring now to FIG. 6, memory model 600 illustrates, in general, how a true-inverted fan-in cone is used as provided in blocks 440 and 450 of FIG. 4. As shown, for a word 630 an address fan-in is identified 620 containing N address lines—A1, A2, A3 . . . AN. When the word 630 is selected, the values of the address lines (A1, A2, A3 . . . AN) will contain a sequence of 1s and 0s. The individual address lines corresponding to a 0 when a word is selected represent inverted values and a 1 represents true values. Note that since every memory model requires a unique address for each word, true-inverted fan-in cones for each word is also unique. Thus, tracing (analyzing the structure of the memory model) a true-inverted fan-in cone of a word uniquely identifies the word selected according to the pattern of true and inverted address bits. As one of skill in the art with the benefit of this disclosure will appreciate, the tracing can also be a functional tracing. Functional tracing includes the type of tracing in which a functionality of addressing a word is followed in the tracing procedure, such as the function of a logic gate and tracing the inputs of the logic gates back to address lines.

Figure 7:
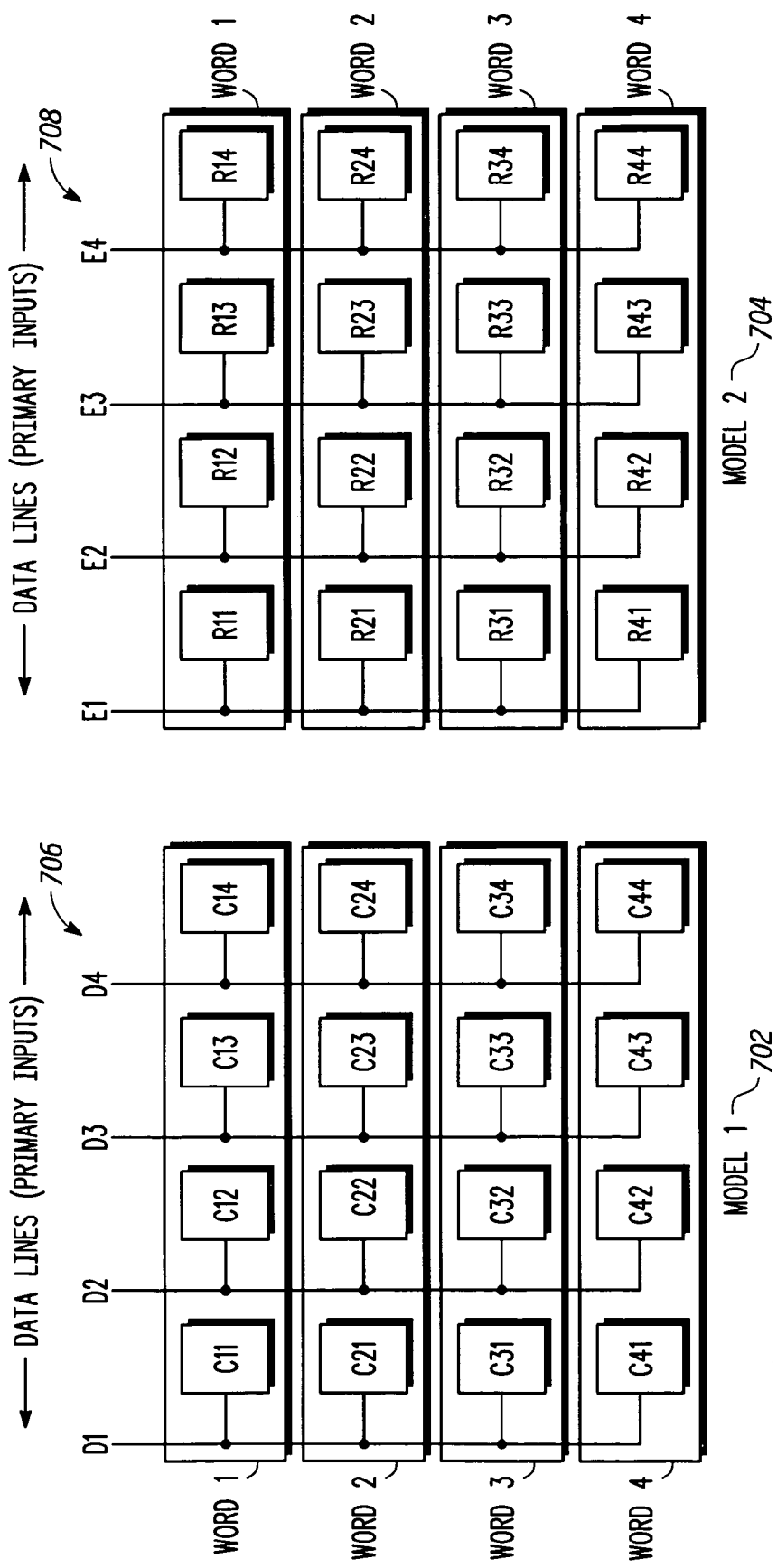
FIG. 7 is a detailed block diagram of a memory illustrating how identification of bit-cells in a pair of corresponding words is used, as provided in FIG. 3 in accordance with an embodiment of the present invention.

Referring to FIG. 7, a memory model illustrates identifying bit-cell correspondence in a pair of corresponding words (block 350, FIG. 3). After the process of identifying corresponding words of memory model 1 702 and memory model 2 704, it could be discovered that the following word correspondence holds: word 1 of model 1 corresponds to word 4 of model 2; word 2 of model 1 corresponds to word 3 of model 2; word 3 of model 1 corresponds to word 2 of model 2; and word 4 of model 1 corresponds to word 1 of model 2. In a case in which the optional data manipulation logic (block 112 of FIG. 1) is absent or the case is simple (simple meaning requiring a minimal logic gates), data line fan-in structural analysis performed with the knowledge of correspondence between data lines in the two models (that are also primary inputs to the models) would enable bit-cell identification for a first word from memory model 1 and a second word from a memory model 2. The following describes an embodiment of the data line fan-in structural analysis process.

The knowledge of all primary inputs (all data lines are also primary inputs) correspondence is known from the user (332 of FIG. 3). Data lines of model 1, i.e., D1, D2, D3 and D4 706, can be assumed to correspond to the data lines E3, E4, E2 and E1 708 of model 2, respectively.

According to a method in accordance with an embodiment, a memory address is chosen that selects a pair of corresponding words. For example, an arbitrary memory address can be chosen that addresses a pair of corresponding words, word 2 of model 1 and word 3 of model 2. The only data value that can be written into the bit-cell C21 (belonging to word 2 of model 1) is the data value supplied by the data line D1. Similarly, the only data value that can be written in the bit-cell R33 (belonging to word 3 of model 2) is that supplied by data line E3. The data on data line D1 is always the same as the data on data line E3, because D1 and E3 are corresponding primary inputs. Therefore, the bit-cell C21 always will have the same data value as that in the bit-cell R33 and so the bit-cell C21 corresponds to the bit-cell R33. Similar structural analysis leads to further identification of bit-cells: the bit-cell C22 corresponds to the bit-cell R34 (connected to corresponding data lines D2 and E4), the bit-cell C23 corresponds to the bit-cell R32 (connected to corresponding data lines D3 and E2), and the bit-cell C24 corresponds to the bit-cell R31 (connected to corresponding data lines D4 and E1).

Therefore, according to an embodiment, data line fan-in structural analysis can be used to identify corresponding bit-cells within corresponding words for memories for which data manipulation logic (112 of FIG. 1) is absent or simple. However, because data lines (102 of FIG. 1) can be manipulated by complex data manipulation logic (112 of FIG. 1) before they reach the memory bit-cells (130 of FIG. 1), a data-line fan-in structural analysis may fail to uniquely identify bit-cells in corresponding words. As described below, the identification of bit-cell correspondence in such complex cases is described wherein the data manipulation logic is present in the memory models.

Referring now to FIG. 8, a flow diagram illustrates how correspondence of bit-cells in a pair of corresponding words are identified as shown in block 350 in FIG. 3. According to an embodiment, for those bit-cells for which a data line fan-in structural analysis will not completely be able to identify bit-cell correspondence between a pair of corresponding words of the memory models, an embodiment provides for performing unique writes into corresponding words. The process starts with block 810 and control passes to block 820 which provides for choosing an address, thus obtaining a corresponding pair of words, word 1 from model 1 and word 2 from model 2. Block 830 provides for generating a series of word-sized data, which when written into words 1 and 2, each bit-cell of words 1 and 2 receives a unique binary sequence. Block 840 provides for performing a series of writes using the series of word-sized data into the predetermined word (word 1) of model 1. Block 850 provides for performing a series of writes using the series of word-sized data into the predetermined word (word 2) of model 2 with the same series of word-sized data as used by model 1. Block 860 provides for comparing the unique bit-cell binary sequences written into the bit-cells of the predetermined words of models 1 and model 2 to obtain bit-cell correspondences. Once the bit-cell correspondences are done, the process is finished as shown in block 870.

Referring now to FIG. 9, two bit-cell groups are shown to illustrate a simple example. As shown, two models include memory model 1, 910, and memory model 2, 920, which is another model of the same memory. Circuit model 910 contains four words (word 1, word 2, word 3, and word 4) and circuit model 920 contains four words (word 1, word 2, word 3, and word 4). After the process described in FIG. 4, suppose that the following words correspond to each other, word 1 of model 1 corresponds to word 1 of model 2, word 2 of model 1 corresponds to word 3 of model 2, word 3 of model 1 corresponds to word 2 of model 2, and word 4 of model 1 corresponds to word 4 of model 2 (shown with arrows). Next, the method provides for choosing an arbitrary address to get a pair of corresponding words. For example, choose an address of corresponding words, word 1 of memory model 1 and word 1 of memory model 2. To find the bit-cell correspondence between the bit-cells of the words chosen, it can be assumed that word 1 of model 1 has bit-cells C11, C12, C13 and C14; and word 1 of model 2 has bit-cells RI 1, R12, R13 and R14.

For the purpose of the following discussion, the term "invert" is more particularly defined. The binary numbers "0" and "1" are inverts of each other. Also, if "0" (or "1") is inverted, then "1" (or "0") results. Additionally, the binary sequence "11100" the invert of the binary sequence "000111" because all the bits in the former sequence are inverts of the bits of the latter sequence. Similarly, the binary sequence "00011" is said to be an invert of the binary sequence "11100". Also, bit sequences "00011" and "11100" are said to have inverted equality, because their individual bits are equal when inverted.

As described herein, the terms "bit sequence" and "binary sequence" are referred to interchangeably to mean a sequence of binary bits. Also, a binary sequence written into a word is referred to as a word binary sequence and that written into a bit-cell is referred to as a bit-cell binary sequence. To identify correspondence between the bit-cells of the corresponding words of the two models, first, unique word binary sequences 930 are written into the chosen words (word 1 of model 1 and word 1 of model 2) such that, first, each bit in word 1 of model 1 and each bit of word 1 of model 2 receives a bit-cell binary sequence. That is, no two bits of word 1 of model 1 receive the same bit-cell binary sequence; and no two bits of word 1 of model 2 receive the same bit-cell binary sequence. Second, no two bits in word 1 of model 1 should receive the invert of each others' bit-cell binary sequence, and no two bits in word 1 of model 2 should receive the invert of each others' unique bit-cell binary sequence. Therefore, an embodiment enables determining the bit-cell correspondence by comparing the unique bit-cell binary sequence as written into each individual bit-cell. Thus, as shown, three sample writes are made into corresponding words: word 1 of memory model 910 and word 2 of memory model 920.

A unique word binary sequence written into each corresponding word of the two memory models can be "0, 0, 0, 0", a unique word binary sequence written into the corresponding words can be "0, 0, 1, 1"; and a unique word binary sequence written into the same corresponding words can be "0, 1, 1, 0". Further analysis using these unique writes indicates that bit-cell C13 received bit-cell binary sequence "011" 940 and bit-cell R14 also received unique bit-cell binary sequence "011" 950. Comparing the bit-cell binary sequences received by each bit-cell of word 1 of memory model 1 and each bit-cell of word 1 of memory model 2, it is demonstrated that bit-cells R14 and C13 correspond to each other. One of skill in the art will appreciate that the comparison can be an equality or an inverted equality.

More specifically, if the unique bit-cell binary sequences written into two bit-cells in two models are "011" and "011," then the bit-cells correspond in an equality. An inverted equality can occur if the unique bit-cell binary sequences written into the bit-cells are "011" and "100". In cases wherein the values match with equality, the bit-cells correspond to each other in a true sense. In cases wherein the values match with inverted equality, the bit-cells correspond to each other in an inverted sense. If bit-cell-A of model 1 and bit-cell-B of model 2 correspond to each other in the true sense, then using primary input values that writes a "0" (or a "1") in the bit-cell-A of model 1 results in writing a "0" (or a "1"), i.e., the same binary value, in the bit-cell-B of model 2, and vice versa. If bit-cell-A of model 1 and bit-cell-B of model 2 correspond to each other in the inverted sense, then using primary input values that writes a "0" (or a "1") in the bit-cell-A of model 1 results in writing a "1" (or a "0"), i.e., the inverted binary value, in the bit-cell-B of model 2, and vice versa.

Also, bit-cell C14 corresponds to bit-cell R13 (both receiving unique bit-cell binary sequence "010") and bit cell C11 corresponds to R11 (both receiving unique bit-cell binary sequence "000") and C12 correspond R12 (both receiving unique bit-cell binary sequence "001").

The minimum number of writes that uniquely identify bit-cells in a corresponding pair of words in any memory is a function of the number of bit-cells in a given word. Specifically, according to an embodiment, a memory word having "B" bits requires a minimum of $Ceil(\log_2(B))+1$ unique writes to identify all bit-cells in a word. The function Ceil(x) generates the smallest integer greater than or equal to x. In the simple example of FIG. 4, there are four bits in the words and, thus, the number of writes required are $Ceil(\log_2(4))+1=\log_2(4)+1=2+1=3$ to do the bit-cell correspondence identification. This in turn means that for three writes, three unique word binary sequences will identify all bit-cells, and that each bit-cell in the words will receive a bit-cell binary sequence of length three.

There are two considerations to be taken into account when choosing the word binary sequences that determine the bit-cell binary sequences for the memory writes in bit-cell correspondence identification. First, after all the writes are completed, each bit-cell in a given model, either model 1 and/or model 2, should receive a unique bit-cell binary sequence. In other words, after all the writes are completed, there should not be two bit-cells in the same model (model 1 or model 2) that received the same bit-cell binary sequence (such as sequences "11100" and "11100"). Second, after all the writes are completed, a first bit-cell in a given model (either model 1 and/or model 2) should not receive a bit sequence that has an inverted equality of the bit-cell binary sequence received by a second bit-cell in the same model. In other words, after all writes are completed, there should not be two bit-cells in the same model (model 1 or model 2) that received unique bit-cell binary sequences that are the inverted equality of the other (such as sequences "11100" and "00011").

The method described with reference to FIG. 9 can be implemented efficiently using an automatic method for finding bit-cell correspondence. The method writes into a pair of corresponding words from the memory descriptions of model 1 and model 2 using a series of data patterns that is later used to discover bit-cell correspondences between the bit-cells of the corresponding words.

Figure 10:
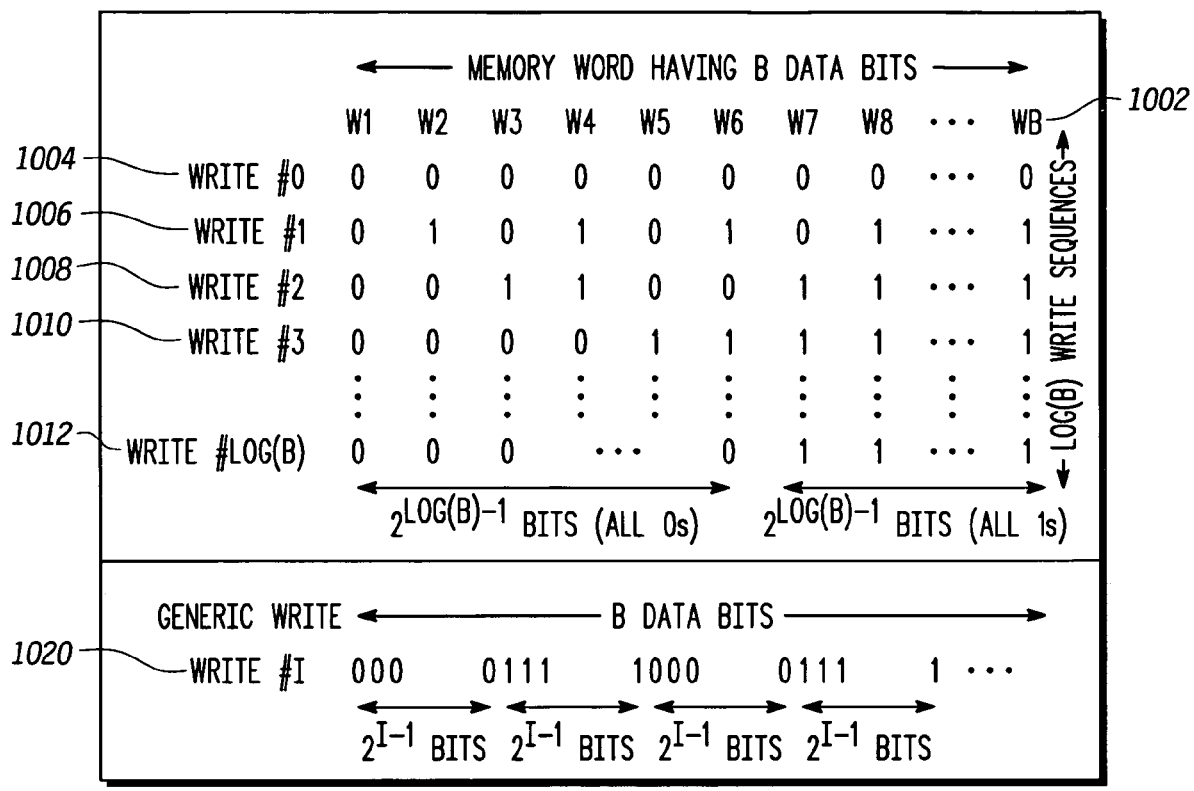
FIG. 10 illustrates a block diagram of a memory word having b data bits, i.e., b bit-cells, being written with a sequence $\log_2(b)+1$ number of writes using word-sized data in accordance with an embodiment of the present invention.

FIG. 10 illustrates the method described in FIG. 9 in general and also provides a method for generating the unique word binary sequences required for writing into corresponding words for bit-cell identification. Note that the procedure can be completely avoided if bit-cell correspondences are found by data line fan-in cone structural analysis using data inputs to individual bit-cells in the two corresponding words of model 1 and model 2 (described illustrated in FIG. 7 and explained in the accompanying text).

FIG. 10 illustrates the data bit values for the sequence of writes using unique word binary sequences on a memory word having B data bits shown as W1, W2, W3, W4, W5, W6, W7, W8, . . . WB 1002. As described above, a number of unique patterns are written to the memory words; the number of patterns being a function of the number of bit-cells in each word therein, such as $Ceil(\log_2(B))+1$ patterns, wherein B is a word width. For simplicity of explanation, but without the loss of generality, take B as a power of two (such as $1=2^0, 2=2^1, 4=2^2, 8=2^3, 16=2^4, \ldots$ etc.) in which case $Ceil(\log_2(B))$ 1 becomes equal to $\log_2(B)+1$. As shown, write #0 1004 is 0, 0, 0, 0, . . . i.e., a word binary sequence of B zeroes. Write #1 1006 is 0, 1, 0, 1, 0, 1, 0, 1, . . . 1. The word binary sequence of write #1 can be described as a word binary sequence of B bits wherein a binary sequence of 1 (note: $1=2^{1-1}$) zero and 1 one is repeated. Write #2 1008 is 0, 0, 1, 1, 0, 0, 1, 1, . . . 1. The word binary sequence of write #2 can be described as a word binary sequence of B bits wherein a binary sequence of 2 (note: $2=2^{2-1}$) zeros and 2 ones are repeated. Write #3 1010 is 0, 0, 0, 0, 1, 1, 1, 1, . . . 1. The word binary sequence of write #3 can be described as a word binary sequence of B bits wherein a binary sequence of 4 (note: $4=2^{3-1}$) zeroes and 4 ones are repeated. Similarly, write #($\log_2(B)$) 1012 is 0, 0, 0, . . . 0 ($2^{log(B)-1}$ 0's), 1, 1, . . . 1 ($2^{log(B)-1}$ 1's), . . . . The word binary sequence of write #($\log_2(B)$) can be described as a word binary sequence of B bits wherein a binary sequence of $2^{log(B)-1}$ zeroes and $2^{log(B)-1}$ ones are repeated. In an embodiment, wherein B is a power of 2, $2^{log(B)-1}$ zeroes and $2^{log(B)-1}$ ones computes to B/2 zeroes and B/2 ones including the required word binary sequence of B bits in write #($\log_2(B)$). FIG. 10 also illustrates a summary write #1 1020 wherein a word binary sequence of B bits is generated by repeating a binary sequence of $2^{I-1}$ zeroes and $2^{I-1}$ ones. This results in generating the first $2^{I-1}$ bits that are zeroes, next $2^{I-1}$ bits that are ones, and then the next $2^{I-1}$ bits that are zeroes and so on, until all the B bits are generated.

After this step terminates, the correspondence of all words in the two memory models are known, and the bit-cell correspondence for all bit-cells in a pair of corresponding words in the two memory models are also known.

FIGS. 1 through 10 illustrate a method for computing correspondences between the two sets of words of the two memory models and then identifying bit-cells in a pair of corresponding words. The bit-cell correspondences are then generalized using structural regularity characteristics of memories. The following analysis can be performed in case each individual column of bit-cells in memory model 1 is connected to a single data line; and each individual column of bit-cells in memory model 2 is also connected to a single data line. Such memories can be referred to as having a single "section". The number of sections can be input from the user in block 334 of FIG. 3. Thus, referring back to FIG. 3, depending on the number of sections, the blocks 340, 350 and 360 would be repeated until the number of sections is addressed.

Referring back to FIG. 7, a generalization of bit-cell correspondence (360 of FIG. 3) is further illustrated. After the completion of block 350 of FIG. 3, the correspondence between the two sets of words of the two memory models and also the correspondence between the bit-cells of a pair of corresponding words is known. Assume, that after termination of the block 350 of FIG. 3, it is known that: word 1 of memory model 1 corresponds to word 2 of memory model 2, word 2 of memory model 1 corresponds to word 3 of memory model 2, word 3 of memory model 1 corresponds to word 4 of memory model 2, and word 4 of memory model 1 corresponds to word 1 of memory model 2; and also, bit-cells of word 1 of memory model 1 and bit-cells of word 2 of memory model 2 correspond as follows: C11 corresponds to R22, C12 corresponds to R23, C13 corresponds to R24, and C14 corresponds to R21. It can be assumed that the memory models have only one section. In case the memory models contain more than one section, the same analysis has to be repeated for each section. A section can be defined as a portion of a memory model wherein each individual column of bit-cells in memory model 1 is connected to a single data line; and each individual column of bit-cells in memory model 2 is also connected to a single data line.

Focusing on a pair of bit-cells that are corresponding to each other—bit-cells C11 and R22. Bit-cell C11 belongs to column 1 of memory model 1 and bit-cell R22 belongs to column 2 of memory model 2. Because the two columns contain corresponding bit-cells, they can be referred to as "corresponding columns". Similarly, bit-cells C12 and R23 are equivalent and C12 belongs to column 2 of memory model 1 and R23 belongs to column 3 of memory model 2; therefore, the two columns are corresponding to each other. Also, since corresponding bit-cells C13 and R24 belong to column 3 of model 1 and column 4 of model 2 respectively; they are corresponding columns. Following similar arguments, taking into consideration corresponding bit-cells C14 and R21, column 4 of model 1 and column 1 of model 2 are corresponding to each other.

At this point the correspondence between the two sets of words of the two memory models and the correspondence between the two sets of columns of the two memory models is known. Then, iterate through all the corresponding words and corresponding columns of the two memory models and calculate the correspondence between the two sets of bit-cells of the two memory models using the following analysis. If word #u in memory model 1 and word #x in memory model 2 correspond to each other, and column #v in memory model 1 and column #y in memory model 2 correspond to each other, then the bit-cell Cuv (belonging to word #u, column #v of memory model 1) corresponds to bit-cell Rxy (belonging to word #x, column #y of memory model 2). For example, since word 4 of memory model 1 corresponds to word 1 of memory model 2, and columns 1, 2, 3 and 4 of memory model 1 corresponds to columns 2, 3, 4 and 1 of memory model 2, respectively; bit-cells C41, C42, C43, C44 of word 4 of memory model 1 corresponds to bit-cells R12, R13, R14, R11 of word 1 of memory model 2, respectively. Thus, for a memory having a single section, after obtaining the correspondence between the two sets of words in the two memory models, and obtaining the column correspondence information, the bit-cell correspondence for all the bit-cells of the two memory models can be obtained.

Figure 11:
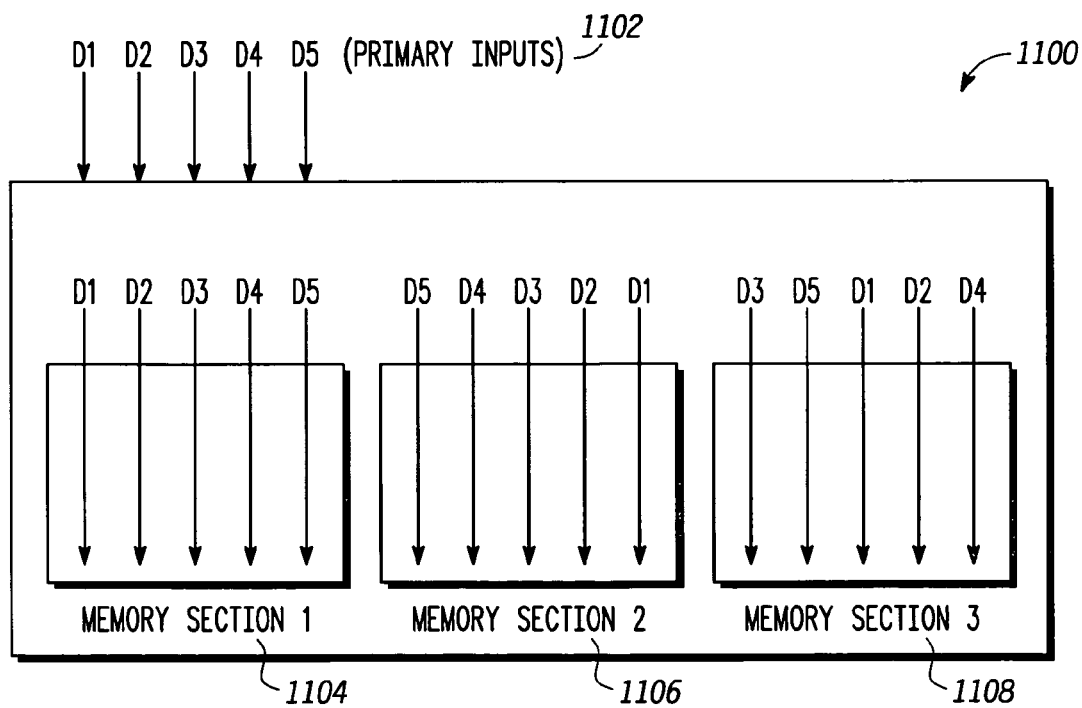
FIG. 11 illustrates a block diagram of a memory with five-bit words with three sections for implementing an embodiment of the present invention.

FIG. 11 illustrates generalization of bit-cell correspondence (block 360 of FIG. 3) in situations wherein a memory model 1100 has more than one section. The memory has five-bit words shown by a plurality of primary input data lines D1, D2, D3, D4, D5, 1102. Also shown are three different sections of the memory—memory section 1, 1104, memory section 2, 1106, and memory section 3, 1108. In memory section 1, 1104, all the bit-cells in the first column are fed by the data line D1; all the bit-cells in the second column are fed by the data line D2; all the bit-cells in the third column are fed by the data line D3; all the bit-cells in the fourth column are fed by the data line D4; and all the bit-cells in the fifth column are fed by the data line D5. In memory section 2, 1106, all the bit-cells in the first column are fed by the data line D5; all the bit-cells in the second column are fed by the data line D4; all the bit-cells in the third column are fed by the data line D3; all the bit-cells in the fourth column are fed by the data line D2; and all the bit-cells in the fifth column are fed by the data line D1. In memory section 3, 1108, all the bit-cells in the first column are fed by the data line D3; all the bit-cells in the second column are fed by the data line D5; all the bit-cells in the third column are fed by the data line D1; all the bit-cells in the fourth column are fed by the data line D2; and all the bit-cells in the fifth column are fed by the data line D4. Typically, the number of sections of a memory model can be determined by simple observation of the memory design. As shown earlier, the procedure described in FIG. 3 calculates bit-cell correspondence for all bit-cells in a single section of a memory model. The same procedure has to be repeated over the different sections of the memory models. In this case, the procedure has to be repeated three times, because there are three distinct sections in the memory model design.

According to an embodiment, if the number of sections in the memory models is not known, then generalization of bit-cell correspondence is not easily obtained. In such a situation after the correspondence between the two sets of words are identified (340 of FIG. 3), the identification of bit-cells between a pair of corresponding words (350 of FIG. 3) is done for all pair of corresponding words in the two memory models. Another solution, which in the average case, can prove to be more efficient than the above exhaustive method is to choose addresses from the address space of the memory models and repeat bit-cell identification for corresponding words from the two memory models (350 of FIG. 3). The addresses of the corresponding words are chosen randomly, including those methods one of ordinary skill in the art will appreciate with the benefit of this disclosure. The fact that there is more than one section in the memory can be detected by performing random writes to the memory. A minimum number of sections can be determined as at least equal to the number of unique bit patterns obtained by performing a known number of random writes. The random writes can be performed into either or both memory models. The bit pattern to be written into a memory model can be a pattern of significance such that a flipping of bits can be discovered. Thus, one pattern can be written to multiple addresses to discover and maximize the uniqueness of the results.

Figure 12:
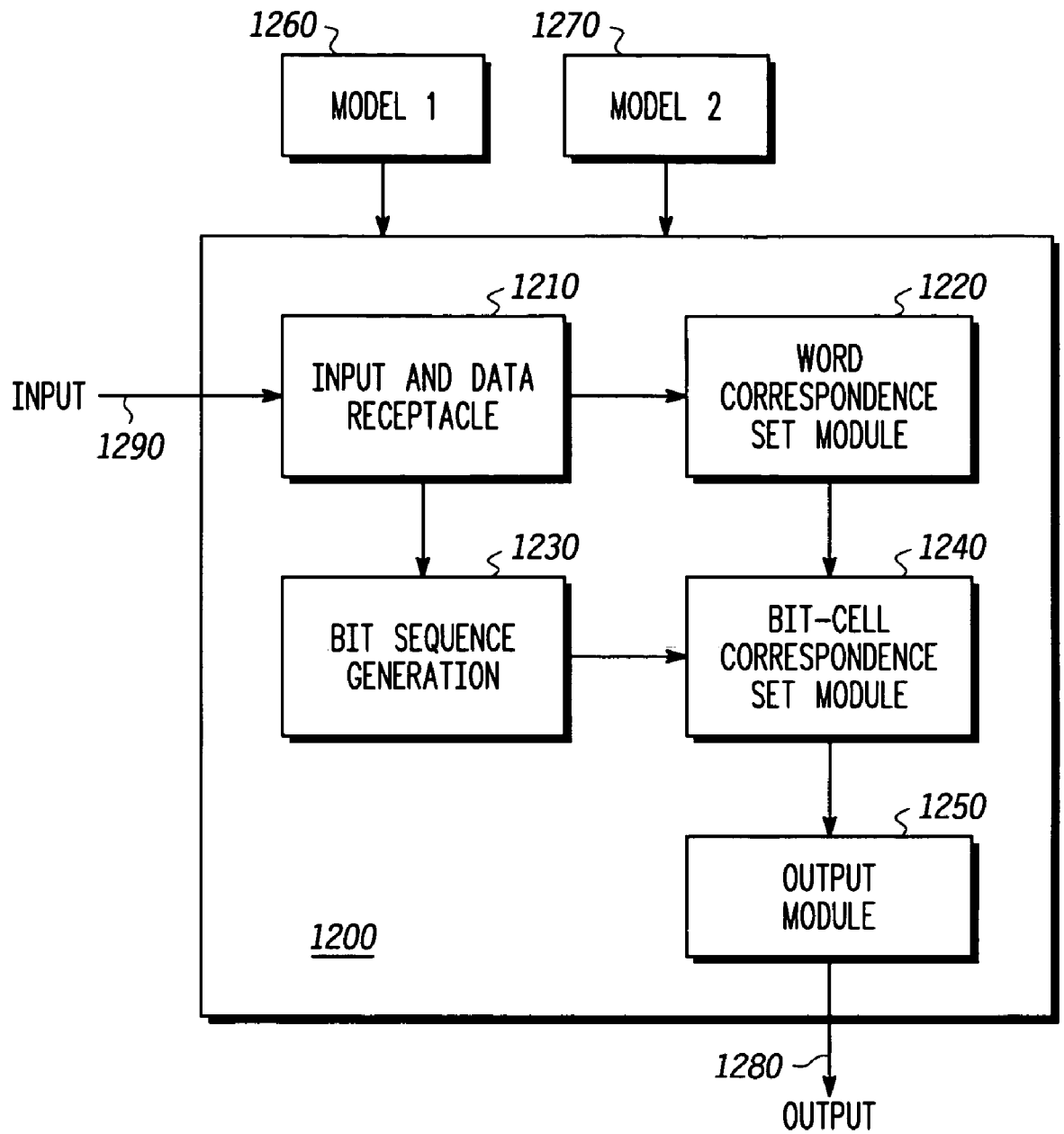
FIG. 12 illustrates a system configured with modules for performing methods in accordance with embodiments of the present invention.

Referring to FIG. 12, an embodiment is directed to a system 1200 that is configured with modules for performing the methods described herein. More specifically, system 1200 is coupled to receive data from memory model 1, 1260, and memory model 2, 1270. Input data, 1290, is received at the module 1210 configured to receive data concerning the models and can be configured to receive correspondence information for primary inputs of the two models and the number of sections in the two models. The number of sections input in module 1210 can be propagated to module 1240 for bit-cell correspondence processing. Module 1210 is shown coupled to the word correspondence set module 1220, which is configured to determine the true-inverted fan-in cones for each word in the first and the second memory models and compute the correspondence between the two sets of words in the first and second memory models. Also shown coupled to module 1210 is the Bit Sequence Generator module 1230 that generates a plurality of unique word binary sequences that are required for doing writes into the memory modules. Module 1220 and module 1230 are also shown coupled to a Bit-cell correspondence set module 1240 configured to choose an arbitrary address associated with the first and second memory models (thus, choosing a pair of corresponding words in the two memory models), perform a plurality of writes into the chosen words of the two memory models, determine bit-cell correspondence for the pair of corresponding words in the two memory models, and perform generalization, using symmetries, to obtain bit-cell correspondence for the entirety of the two memory models. Module 1240 is coupled to the Output module 1250 that provides bit-cell correspondence information at the output 1280.

In view of the many possible embodiments to which the principles of this invention may be applied, it should be recognized that the embodiment described herein with respect to the drawing figures is meant to be illustrative only and should not be taken as limiting the scope of invention. For example, the methods provided could be implemented in conjunction with existing techniques to expand the capabilities of the prior art methods by adding the disclosed methods herein as a filter to an existing sequence of filters such as an additional filter to a fan-in cone analysis filter, a fan-out cone analysis filter, or a random simulation filter or the like. Further, in another example, the methods and systems disclosed herein can be implemented to identify correspondences in memory models that are not embedded in a microprocessor, such as stand-alone memories. Those skilled in the art will recognize that the elements of the illustrated embodiment shown in software may be implemented in hardware and vice versa or that the illustrated embodiment can be modified in arrangement and detail without departing from the spirit of the invention. Therefore, the invention as described herein contemplates all such embodiments as may come within the scope of the following claims and equivalents thereof.

We claim:

1. A method for automatically generating a bit-cell correspondence between a first memory model and at least a second memory model, the method comprising:
    receiving data from the first and second memory model;
    receiving primary input and output correspondence for the first and second memory model;
    identifying word correspondence between the first and second memory model by comparing the true-inverted fan-in cones of words in the first and second memory models; and
    identifying bit-cells in one or more pairs of corresponding words to generate the bit-cell correspondence;

wherein the first and second memory models contain k sections, where $k \geq 1$, and further comprising:
    if a priori knowledge concerning the value of k is known, then using k to determine bit-cell correspondences for the first and second memory models.

2. The method of claim 1 further comprising generalizing bit-cell correspondence obtained on the bit-cells of the one or more pairs of corresponding words to obtain bit-cell correspondence for bit-cells in the first and the second memory models.

3. The method of claim 1 wherein bit-cell correspondence includes correspondences that are in a true sense and an inverted sense.

4. The method of claim 1 wherein the identifying bit-cells includes:
    choosing an arbitrary address associated with the first and second memory models;
    writing a plurality of word binary sequences into a first word addressed by the arbitrary address in the first memory model;
    writing the plurality of word binary sequences into a second word addressed by the same arbitrary address in the second memory model; and
    obtaining a set of bit-cell correspondences for the bit-cells of the first word in the first memory model and the second word in the second memory model.

5. The method of claim 4 wherein the plurality of word binary sequences is a predetermined number of patterns, and wherein the number of patterns is determined using a function including a logarithm to the base 2 of the number of bit-cells in a word.

6. The method of claim 4 wherein a correspondence is detected if one of a plurality of bit-cell binary sequences resulting from the writing of the plurality of word binary sequences written into a bit-cell of the first memory model is either equal to, or is equal to the invert of, another of the plurality of bit-cell binary sequences written into a bit-cell in the second memory model for the corresponding words.

7. The method of claim 4 wherein the plurality of word binary sequences results in bit-cell binary sequences that are unique and are not an invert of another bit-cell binary sequence.

8. The method of claim 1 wherein each of the first and second memory models include one or more of a circuit level memory model, a register transfer language (RTL) memory model, a lowest level memory model, and a highest level memory model.

9. The method of claim 1 further comprising:
    if the memory has one section, then determining the bit-cell correspondence for a pair of corresponding words; and
    generalizing results obtained to all bit-cells of the memory models.

10. The method of claim 1 further comprising:
    if the memory has multiple sections, then for each section finding a bit-cell correspondence for at least one pair of corresponding words; and
    generalizing results obtained to all bit-cells of the section.

11. The method of claim 1 wherein if the memory has no data manipulation, then logic bit-cell correspondence is found using structural analysis of the bit-cells of corresponding words.

12. The method of claim 1 further comprising:
    determining whether the memory represented by the first and second memory model is divided into different sections such that each individual section has each of the plurality of data lines connected with bit-cells having data lines that do not change with different words across a given memory column.

13. The method of claim 12 wherein the determining includes performing random writes into the first and second memory models to discover whether more than one section in the memory exists.

14. The method of claim 1 wherein identifying word correspondence includes obtaining a plurality of true-inverted fan-in cone sets by making a distinction between each address line and its complement in determining a dependence for each word.

15. The method of claim 14 wherein the distinction between each address line and its complement enables determining an address that corresponds to each word in the two memory models.

16. A method for automatically generating a bit-cell correspondence between first and second memory models which each contain k sections, where $k \geq 1$, the method comprising:
   receiving data from the first and second memory models;
   receiving primary input and output correspondence for the first and second memory models;
   identifying word correspondence between the first and second memory models;
   identifying bit-cells in one or more pairs of corresponding words to generate the bit-cell correspondence;
   if the memory has multiple sections, then for each section finding a bit-cell correspondence for at least one pair of corresponding words; and
   generalizing results obtained to all bit-cells of the section.

17. The method of claim 16 wherein, if a priori knowledge concerning the value of k is known, then using k to determine bit-cell correspondences for the first and second memory models.

18. The method of claim 16 wherein bit-cell correspondence includes correspondences that are in a true sense and an inverted sense.

19. The method of claim 16 wherein the identifying bit-cells includes:
   choosing an arbitrary address associated with the first and second memory models;
   writing a plurality of word binary sequences into a first word addressed by the arbitrary address in the first memory model;
   writing the plurality of word binary sequences into a second word addressed by the same arbitrary address in the second memory model; and
   obtaining a set of bit-cell correspondences for the bit-cells of the first word in the first memory model and the second word in the second memory model.

20. A method for automatically generating a bit-cell correspondence between first and second memory models, the method comprising:
   receiving data from the first and second memory models;
   receiving primary input and output correspondence for the first and second memory models;
   identifying word correspondence between the first and second memory models; and
   identifying bit-cells in one or more pairs of corresponding words by writing a plurality of word binary sequences into the first and second memory models, thereby generating a bit-cell correspondence;
   wherein the plurality of word binary sequences is a predetermined number of patterns, and
   wherein the number of patterns is determined using a function including a logarithm to the base 2 of the number of bit-cells in a word.

21. The method of claim 20, wherein the step of identifying bit-cells further includes:
   choosing an arbitrary address associated with the first and second memory models;
   writing the plurality of word binary sequences into a first word addressed by the arbitrary address in the first memory model;
   writing the plurality of word binary sequences into a second word addressed by the same arbitrary address in the second memory model; and
   obtaining a set of bit-cell correspondences for the bit-cells of the first word in the first memory model and the second word in the second memory model.

22. The method of claim 20 wherein bit-cell correspondence includes correspondences that are in a true sense and an inverted sense.

23. A method for automatically generating a bit-cell correspondence between first and second memory models, the method comprising:
   receiving data from the first and second memory model;
   receiving primary input and output correspondence for the first and second memory model;
   identifying word correspondence between the first and second memory model;
   identifying bit-cells in one or more pairs of corresponding words to generate the bit-cell correspondence; and
   determining whether the memory represented by the first and second memory model is divided into different sections such that each individual section has each of the plurality of data lines connected with bit-cells having data lines that do not change with different words across a given memory column.

24. The method of claim 23, wherein the step of determining includes performing random writes into the first and second memory models to discover whether more than one section in the memory exists.

25. The method of claim 23 wherein bit-cell correspondence includes correspondences that are in a true sense and an inverted sense.

26. The method of claim 23 wherein the identifying bit-cells includes:
   choosing an arbitrary address associated with the first and second memory models;
   writing a plurality of word binary sequences into a first word addressed by the arbitrary address in the first memory model;
   writing the plurality of word binary sequences into a second word addressed by the same arbitrary address in the second memory model; and
   obtaining a set of bit-cell correspondences for the bit-cells of the first word in the first memory model and the second word in the second memory model.

* * * * *